United States Patent [19]
Larabell

[11] Patent Number: 5,507,650
[45] Date of Patent: Apr. 16, 1996

[54] UNIVERSAL SLIDE MOUNTED ADAPTOR FOR STORAGE DEVICES

[75] Inventor: Henri J. Larabell, Cupertino, Calif.

[73] Assignee: HJS & E Engineering, Sunnyvale, Calif.

[21] Appl. No.: 157,675

[22] Filed: Nov. 24, 1993

Related U.S. Application Data

[63] Continuation-in-part of Ser. No. 976,416, Nov. 16, 1992, Pat. No. 5,299,944.

[51] Int. Cl.⁶ .................................................. H01R 13/629
[52] U.S. Cl. .......................... 439/61; 361/685; 439/928.1; 439/955
[58] Field of Search ............................. 439/61, 374, 377, 439/928, 502, 505, 928.1, 955; 361/683–685

[56] References Cited

U.S. PATENT DOCUMENTS

| | | | |
|---|---|---|---|
| Re. 34,369 | 9/1993 | Darden et al. | 439/377 |
| D. 308,052 | 5/1990 | Darden et al. | D14/109 |
| 2,897,033 | 7/1959 | Ford . | |
| 3,488,622 | 1/1970 | Gley . | |
| 3,784,954 | 1/1974 | Grimm et al. | 339/17 |
| 4,071,722 | 1/1978 | Hart | 200/50 |
| 4,152,038 | 5/1979 | Inouye et al. | 339/75 |
| 4,614,389 | 9/1986 | Albert et al. | 339/45 |
| 4,717,982 | 1/1988 | Toreson et al. | 360/137 |
| 4,754,397 | 6/1988 | Varaiya et al. | 361/683 |
| 4,838,814 | 6/1989 | Takai et al. | 439/502 |
| 4,932,907 | 6/1990 | Robinson et al. | 361/391 |
| 4,941,841 | 7/1990 | Darden et al. | 361/685 |
| 4,973,264 | 11/1990 | Kamono et al. | 439/498 |
| 4,982,303 | 1/1991 | Krenz | 360/137 |
| 5,003,431 | 3/1991 | Imsdahl | 361/415 |
| 5,010,426 | 4/1991 | Krenz | 360/97.01 |
| 5,035,634 | 7/1991 | Hasircoglu et al. | 439/157 |
| 5,045,960 | 9/1991 | Eding | 360/97.01 |
| 5,135,410 | 8/1992 | Kawase et al. | 439/372 |
| 5,155,662 | 10/1992 | I-Shou | 361/392 |
| 5,269,698 | 12/1993 | Singer | 439/157 |
| 5,277,615 | 1/1994 | Hastings et al. | 439/64 |
| 5,288,246 | 2/1994 | Whiteman, Jr. | 439/540 |
| 5,299,944 | 4/1994 | Larabell et al. | 439/157 |
| 5,325,263 | 6/1994 | Singer et al. | 361/798 |
| 5,333,098 | 7/1994 | DeLuca et al. | 361/685 |

FOREIGN PATENT DOCUMENTS

| | | | |
|---|---|---|---|
| 1114461 | 5/1968 | United Kingdom | 439/557 |

*Primary Examiner*—Neil Abrams
*Attorney, Agent, or Firm*—Law Offices of Douglas A. Chaikin

[57] ABSTRACT

Disclosed herein is an array of daisy chained slides for receiving carrier mounted electrical devices for connection with electrical equipment. The daisy chained array includes a bus cable having two ends and a data connector attached at each end. The bus cable is adapted for connection with the electrical equipment. The array also includes a plurality of slides, each slide having a slide data connector. Each data connector is attached to the cable between the ends in a daisy chained fashion. Each of the slides is adapted to receive a carrier compatible for sliding and mating connection with the slide. The carrier includes an electrical device, such as a hard or floppy disk. The carrier has a carrier data connector for mating with the slide data connector. The carrier data connector is attached to one end of a stub cable. The other end of the stub cable is attached to a device data connector for connection with the electrical device. In a typical application the slides are mounted within an enclosure including a power supply. The daisy chained array is used to extend a SCSI bus. Carrier mounted hard disks are then conveniently removed and installed while the system continues to operate. The carrier also includes a switch for assigning an identification number to the electrical device.

19 Claims, 11 Drawing Sheets

UNIVERSAL SLIDE MOUNTED ADAPTOR FOR STORAGE DEVICES

CROSS-REFERENCE TO RELATED APPLICATIONS

This application is a continuation-in-part of U.S. application, Ser. No. 07/976,416, filed Nov. 16, 1992, now U.S. Pat. No. 5,299,944.

FIELD OF THE INVENTION

This invention relates to computer peripherals and more particularly to an array of daisy chained slides for connection to electrical equipment such as computers, and more particularly to an array of slides which can accept a variety of differently sized electrical devices, such as hard disks, and having a variety of different electrical configurations.

PREVIOUS ART

The personal computer has gone through an incredible transformation since its inception in the early 1970's. For example, the original IBM PC used an Intel 8086 microprocessor and had only a single low density floppy drive of 360 kilobytes storage capacity, a RAM capacity of 64 kilobytes, and a 13" mono-chrome display terminal. Later, faster and better microprocessors were develop including the 8088, the 80286, the 80386 and currently the 80486.

Faster and increased memory storage capacity was developed by the addition of a hard disk drive assembly and greater RAM (today 8 megabytes is not uncommon). The original hard disk drive assembly typically had a capacity of 20 megabytes with 40 megabytes being state of the art. Currently, a typical hard disk drive assembly will be at least 100 megabytes and it is not uncommon for the hard disk drive of even a typical office user to have a capacity of 500 megabytes or even one or more giga-bytes.

Greater capacity floppy disk drives were concurrently developed with the hard disk drive assembly. While the original floppy disk drive typically had a capacity of only 360 kilobytes, later floppy disk drives had capacities of 720 kilobytes and 1.2 megabytes. Currently, there is a floppy disk drive having a capacity of 2.88 megabytes. These greater capacity floppy disk drives are smaller and faster than the original.

One very important reason for having a floppy disk drive was to be able to transfer computer work product from one user to another electronically rather than via hard copy. This saved the users time and money and increased their efficiency and output. The work product would not have to be re-created over and over again. The users simply added their modifications to the computer work product until the project was complete.

As can well be appreciated, the users were limited only by the capacities of the floppy disk drive. Additionally, since the speed of the floppy disk drive is far less than the hard disk drive, it is desirable to be able to exchange hard disk drives rather than only floppy disk drives.

As an alternative to the high cost of a main frame computer and the lower capabilities of the PC, work stations such as the Sun and others were developed. The work station operates at a far greater speed and capacity than the PC and in some cases approaches the smaller main frames. The price of the work station is closer to the PC than the main frame.

The speed, capacity and capabilities of both the PC and the work station are continuing to increase at a dramatic rate even at this time. As a result, there are many more serious users of such electrical equipment requiring the need to exchange not only floppy and hard disk drives, but other electrical devices, such as memory storage devices. Such devices include tape drives, digital tape drives, optical disk drives and the like.

Such users are finding it more and more desirable to exchange their work product via a memory storage device, just as was once done with main frame computers. It is now not uncommon for a user of a work station (or for that matter a PC) to have multiple memory storage devices. One such way of having multiple memory storage devices is to use a "shoe" box. A "shoe" box is understood by those skilled in the art to be an enclosure wherein such multiple memory storage devices may be housed and electrically connected together and to the host computer.

Removal and replacement of electrical devices, such as memory storage devices must be done with great care. The installation and removal of such electrical devices can cause the electrical connections to become damaged beyond simple repair. An entire mother board or even controller may need to be replaced in order to repair such damage. Therefore, alignment of the connectors of different electrical devices must match exactly with the host computer or the shoe box.

It will be appreciated that not all electrical devices are physically of the same size. It is therefore desirable to have an assembly which facilitates the installation and removal of a large variety of different sized electrical devices. It is further desirable to have such a device which is easy to use and makes the installation and removal of such devices routine while not causing damage to either the electrical device or the electrical equipment.

Additionally, care must be taken to prevent the loss of data on such electrical devices, especially the memory storage devices. It is desirable to be able to stop the disk head of a hard disk drive assembly from spinning before removing the same. Currently, there exists a bracket assembly which allows the installation and removal of a certain limited number of hard disk drives. There is still a need for a bracket assembly which is capable of stopping the rotating head of a hard disk drive prior to removal. U.S. Pat. No. 4,960,384 discloses a device which stops the spinning head of a hard disk. U.S. Pat. No. 4,941,841 discloses a bracket assembly for the installation and removal of a hard-disk. A bracket assembly is still desired which can be used with a variety of hard disk drives and other memory storage devices.

In addition to being physically compatible with a wide variety of electrical devices, it would also be desirable for a bracket assembly to accommodate a wide variety of different electronic configurations that are present in electrical devices, such as memory storage devices. There is no known bracket assembly which includes a structure for accomplishing this.

Typically, a work station includes a SCSI bus. A SCSI bus can handle as many as eight concurrent SCSI devices. Each SCSI device must have a unique identification number to be recognized by the bus. Each SCSI device is connected to the bus by a data cable. The data cable includes data and the device identification number.

In order to set the identification number of the SCSI device, the user installs a plurality of jumpers on pins located on the logic board under the device. The user must then be able to adjust the jumpers according to the correct binary code or go to a remote location to set the SCSI identification number using a remote SCSI identification switch which has been connected to the identification pins on the logic board of the SCSI device using a cable.

It would be highly desirable to be able to adjust the SCSI identification number on the bracket assembly without having to either adjust the jumpers on the bottom of the SCSI device or alternatively go to a remote place and then adjust the SCSI identification number. It would save time and eliminate confusion leading to configuration problems and in general allow the exchange or installation and removal of electrical devices to become routine.

In many applications, it is desirable to attach additional electrical devices to a SCSI bus. In some cases, the original enclosure has insufficient space or power to support the additional devices. When this occurs, the SCSI bus can be extended by attaching a length of compatible ribbon cable to one end of the bus in place of a bus termination. The devices are then placed into a separate enclosure having its own power supply if necessary.

It would be desirable to have such an enclosure, including a power supply, which can be easily modified to operate with a variety of electrical devices. It would also be desirable to provide such an enclosure which allows convenient removal and installation of electrical devices while the system is running.

SUMMARY OF THE INVENTION

It is an object of this invention to provide a bracket assembly for facilitating the installation and removal of a variety of different electrical devices into and out of electrical equipment, namely computer equipment.

It is a further object of this invention to provide a bracket assembly for installation and removal of a variety of different SCSI computer peripheral devices into and out of a computer system while that system is operational.

It is a yet further object of this invention to provide a universal bracket assembly as set forth above which accommodates the electrical configuration of a wide variety of electrical devices, namely SCSI memory storage devices.

These objects and those mentioned above and below are accomplished by providing an array of daisy chained slides for receiving carrier mounted electrical devices for connection with electrical equipment, comprising:

a bus cable having two ends and a data connector attached at each end, the bus cable being adapted for connection with the electrical equipment;

a plurality of slides, each slide having a slide data connector, the connector being attached to the cable between the ends in daisy chained fashion, each slide being adapted to receive a carrier compatible for sliding and mating connection with the slide and the carrier including an electrical device, the carrier having a carrier data connector for mating with the slide data connector, the carrier data connector being attached to one end of a stub cable, the other end of the stub cable being attached to a device data connector for connection with the electrical device, whereby the electrical device mounted on the carrier may be conveniently removed, installed or reinstalled for operation with the electrical equipment.

In a preferred embodiment, the invention includes an array of slides daisy chained together by a cable having a data connector at each end. In one configuration, there are at least 2 slides, each slide can accept a carrier mounted electrical device. The slides are installed in an enclosure which includes a power source for operation of the electrical devices. The cable is used to extend a bus of the electrical equipment, and to communicate with the electrical devices.

It is an advantage of this invention to provide a bracket assembly that can be used to routinely remove and install electronic devices from electrical equipment with a minimum danger of physical and electrical damage to either the electrical device or the electrical equipment.

It is an additional advantage of this invention to provide a bracket assembly that can be used to routinely and blindly remove electrical devices from electrical equipment with a minimum danger of physical and electrical damage to either the electrical device or the electrical equipment.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein.

DETAILED DESCRIPTION OF THE INVENTION

The term "slide" as used herein means an essentially rigid, generally rectangular mounting brace which is semi-permanently mounted and electrically connected to the electrical equipment by means of screwless mounting and the like. The slide includes a first electrical interconnect for electrically connecting the slide to the electrical equipment. The slide illustrated in the preferred embodiment, has guide channels for slidable and mating connection with the carrier. In the preferred embodiment of the slide illustrated in the drawing, the slide will include a pair of channels for facilitating in locking and releasing the carrier. In a preferred embodiment, the slide includes an electrical interrupt switch assembly which is capable of cutting off power to the electrical device mounted on the carrier.

The term "carrier" as used herein means an essentially rigid, generally rectangular platform structure. The carrier includes a slot for containment of the second interconnect assembly, and a visual identification switch. The carrier has a platform for connecting an electrical device thereto. In one embodiment the platform has mounting members for the electrical device which are raised above the level of the platform. In another embodiment, the carrier has mounting members which are generally coincident to the level of the platform, but being slightly raised above the platform. The carrier has guide rails which allow it to slideably connect and mate with the slide channels.

The invention will now be described in detail with respect to FIGS. 1–4, wherein there is shown the bracket assembly in accordance with this invention generally denoted by the numeral 100. The bracket assembly 100 includes a slide 102 and a carrier 104. The carrier 104 includes electrical connectors 184, 188 and 217 for connection with the storage device (not shown).

Figure 2:
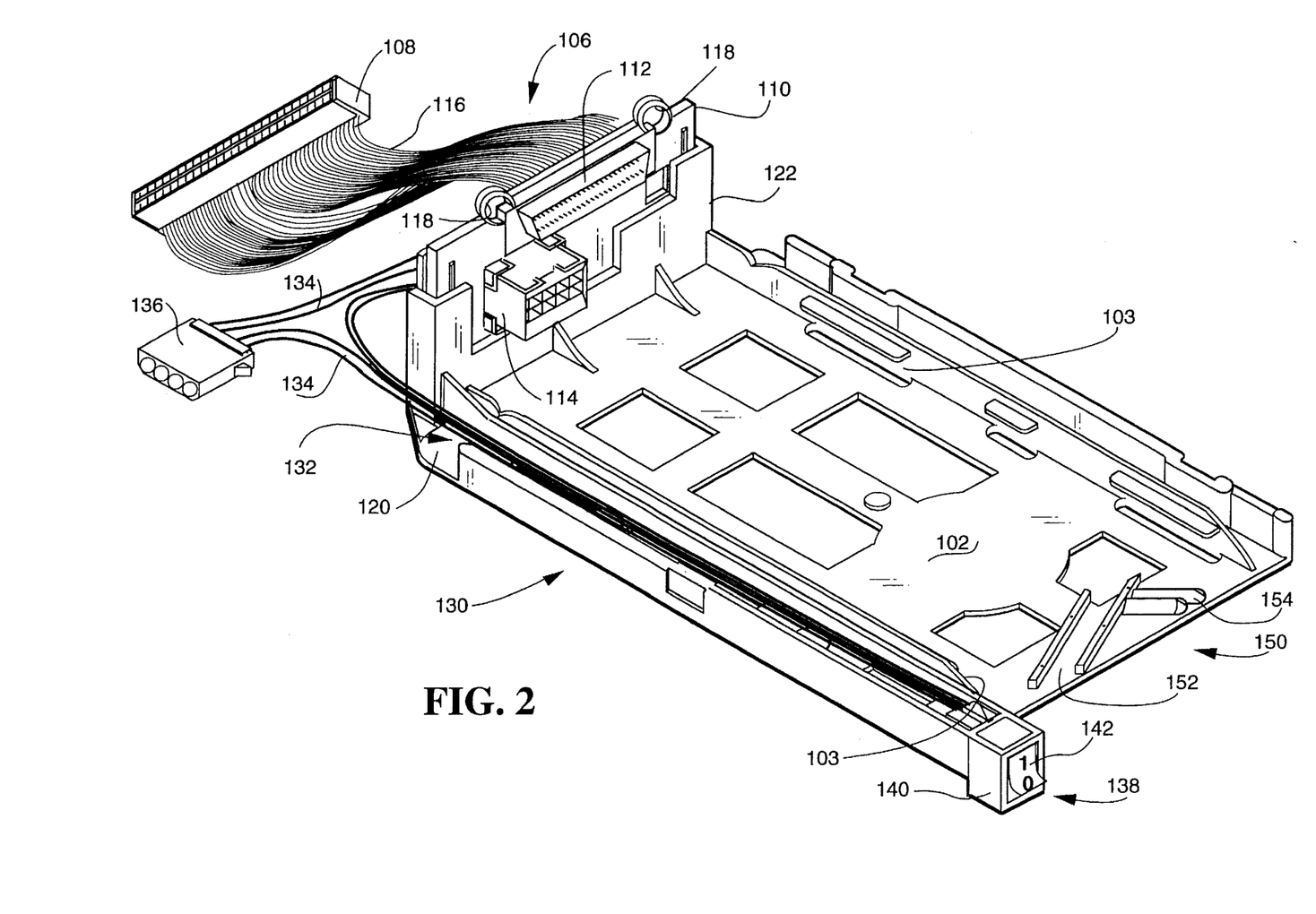
FIG. 2 is an elevated perspective plan view of the slide of FIG. 1.
Figure 3:
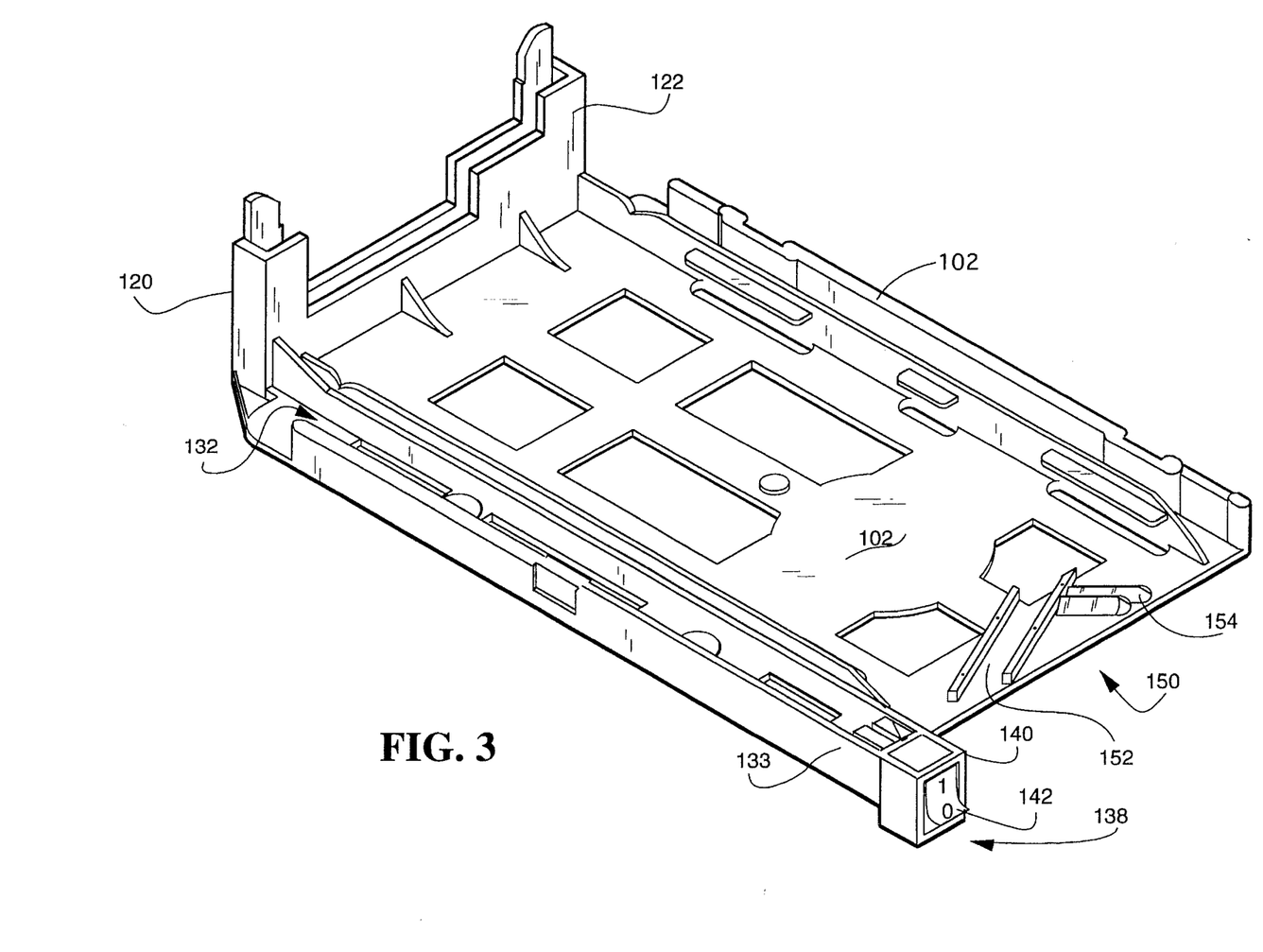
FIG. 3 is an elevated perspective plan view of the slide of FIG. 1.

With particular reference to FIGS. 2 & 3, there is shown the slide 102 having slide channels 103 for slidable and mateable connection of the carrier guide rails as will be discussed more fully below.

As shown in FIG. 2, the slide 102 includes a first electrical interconnect assembly generally denoted by the numeral 106. The first electrical interconnect assembly 106 includes first data connector 108, a support member 110 (best illustrated in FIG. 4) having second data connector 112 and a power supply connector 114. A ribbon cable 116 electrically connects the two data connectors, 108 and 112.

The first data connector 108 electrically connects the slide 102 with the electrical equipment, namely a computer or shoe box. The first data connector 108 is a 50 pin IDC connector.

Figure 4:
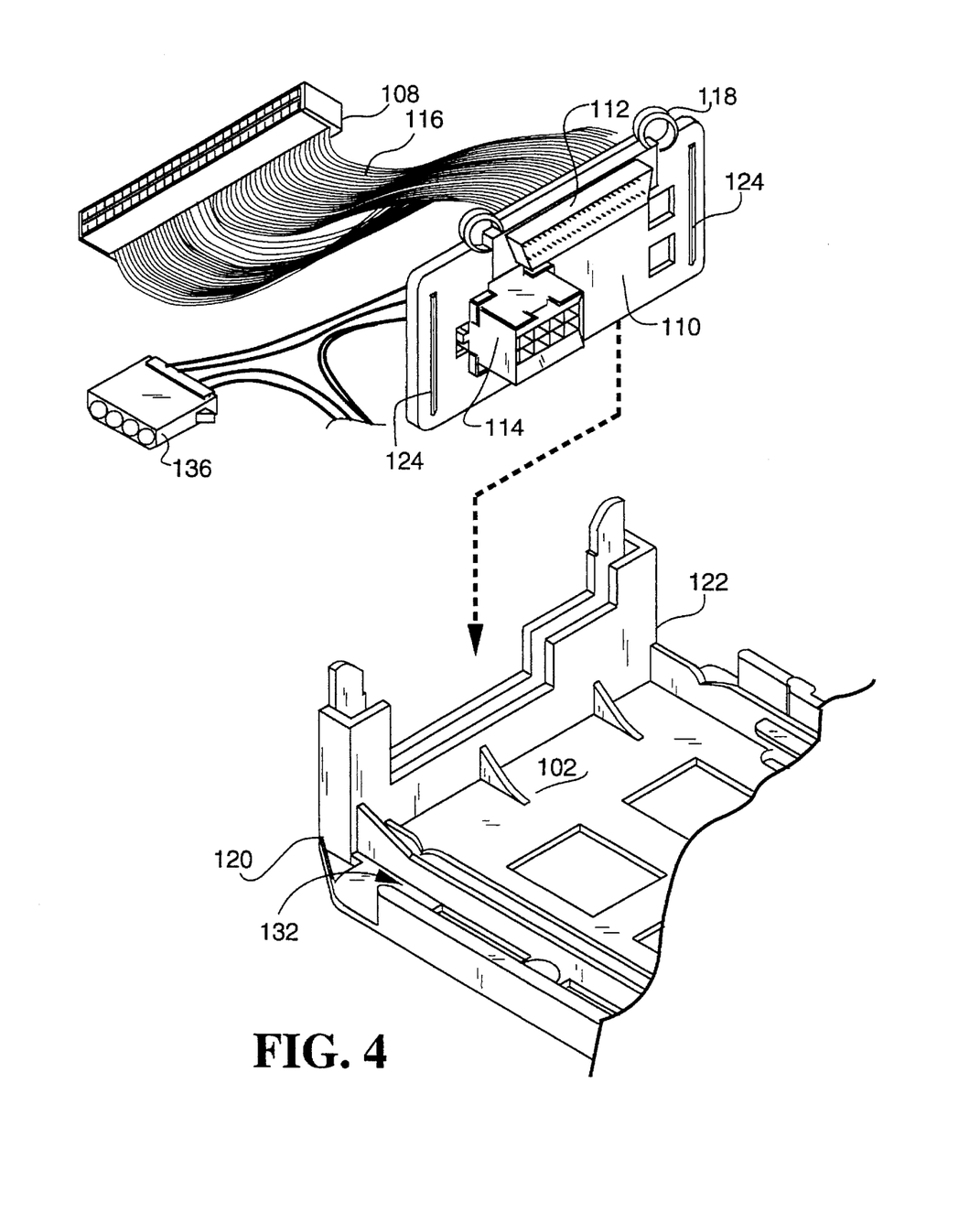
FIG. 4 is a partially exploded view of the first interconnect assembly and the slide illustrating the connection of the first interconnect assembly with the carrier.

As shown in FIG. 4, the support member 110 is generally rectangular and includes a pair of alignment openings 118 for aligning connectors 112 and 114 with mating connectors of the carrier 104. The connectors 112 and 114 are mounted in the support member 110 and when properly aligned facilitate proper physical and electrical connection of the carrier 104 with the slide 102.

The second data connector 112 has an exterior portion adapted for connection to the ribbon cable 116 and an interior portion adapted for blind mating connection with the data connector of the carrier 104.

The third electrical connector 114 is a 10-pin female connector adapted for blind mating connection of the electrical device to the power supply.

The slide 102 has a distal end 120 as best shown in FIGS. 2 & 4. The distal end has an upstanding member 122 defining a slide support receptacle. The support member 110 and the upstanding member 122 are sized and shaped so that the support member 110 slides into the upstanding member 122 with a snug friction fit.

The support member 110 has support guides 124 (FIG. 4) which mate with the upstanding member 122 providing additional friction fit. If desirable the upstanding member 122 may have support ridges for mating with the support guides 124 which will provide greater friction for an even tighter friction fit.

The combination of the support guides 124 and the properly sized and shaped support member 110 and upstanding member 122 provide for a solid physical connection of the connectors 112 and 114 on the slide 102. Additionally, the support member 110 may be removed from the slide 102 should either of the connectors 112 or 114 need to be replaced or repaired.

The slide 102 includes a power interrupt assembly generally indicated by the numeral 130 as best shown in FIGS. 2 & 3. The power interrupt assembly 130 includes the carrier 102 having a power cable channel 132 with a proximal end 133, a power cable 134, a power cable connector 136 at one end of the power cable 134 and a power interrupt switch assembly 138 mounted at the proximal end of the power cable channel 132 and at another end of the power cable 134.

The power cable connector 136 is a Molex 4 position disk drive power connector.

As best shown in FIG. 3, the power cable channel 132 extends from the proximal end of the slide 102 to the distal end of the slide 102. The power interrupt switch assembly 138 includes a housing 140 mounted at the proximal end 133 of the power cable channel 132. Mounted inside the housing 140 is a power switch 142.

As best shown in FIG. 2, the power cable connector 136 connects to a power supply (not shown). The power cable 134 is routed to the power interrupt switch assembly 138 where it is connected to the power switch 142. The power switch 142 has an "on" and an "off" position. The power cable 134 connects third electrical connector 114 of the support member 110 with the power switch 142 and the power cable connector 136.

In the "off" position, the switch 142 does not allow power from the power supply to be supplied to electrical device. Thus, the power from the power supply is interrupted when the power switch 142 is in the off position. Of course in the "on" position, power is routed to the third electrical connector 114 for supplying the electrical device with power.

In the case of the hard disk drive assembly, it is well understood that the head of the hard disk drive flies in close proximity to the rapidly moving memory media, the disk, while power is being supplied to the hard disk drive. If the head should crash as it flies over the surface of the memory media, physical damage to the memory media as well as loss of data is a likely result.

As long the head is flying there is a danger of such damage. However, when power is interrupted by placing the power switch 142 in the "off" position, the head moves to a safe position and the memory media spins down to a full stop and the hard disk drive assembly may be safely removed.

Figure 5:
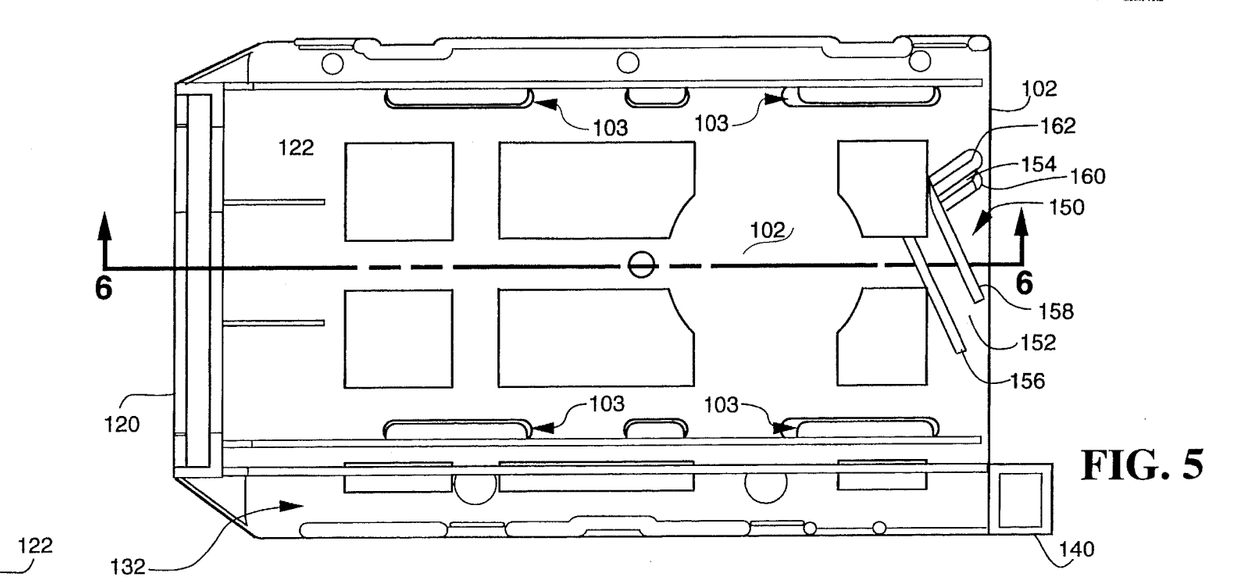
FIGS. 5–7 illustrate the details of the slide in accordance with this invention.
Figures 6, 7:
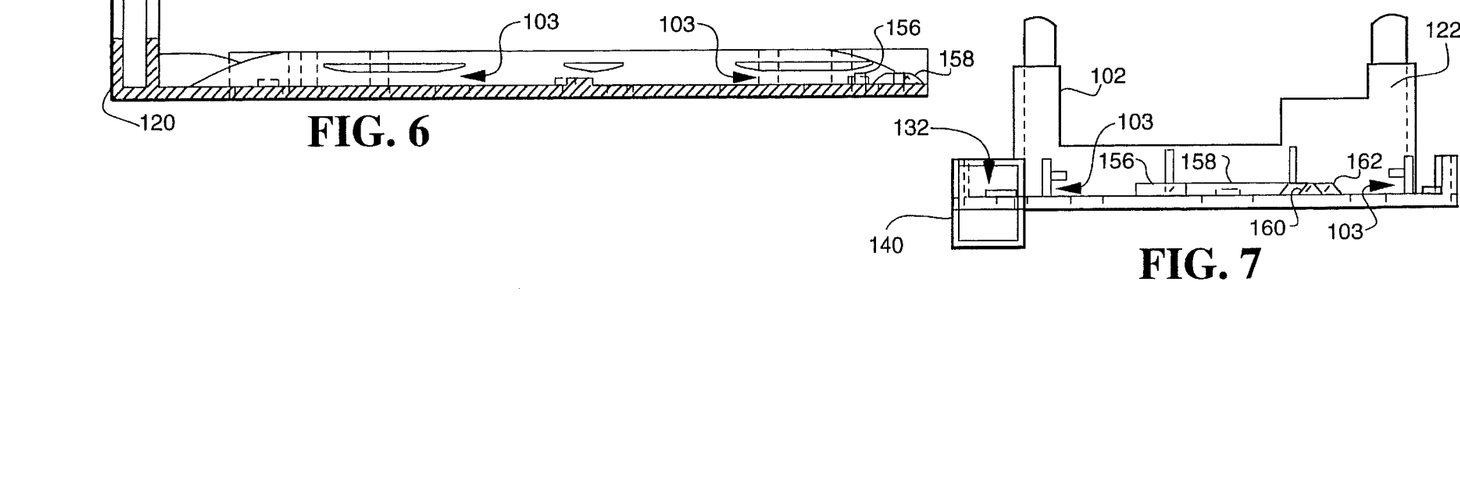
Figure 8:
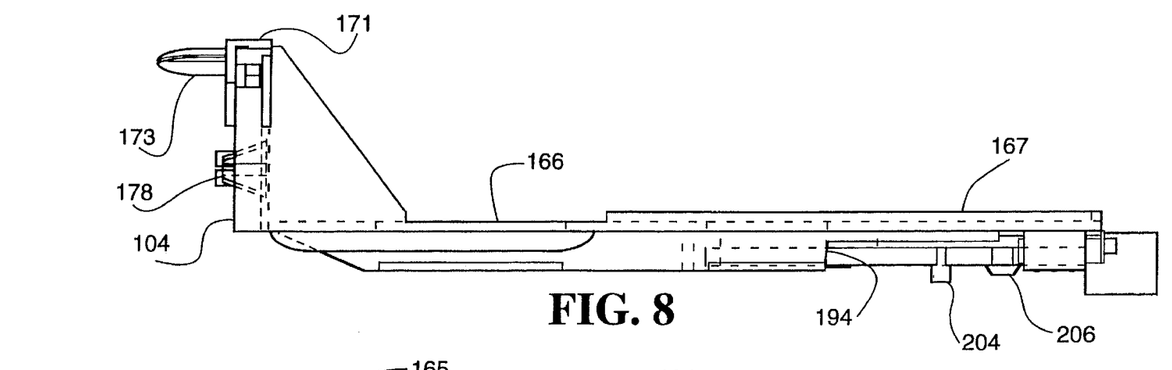
FIGS. 8 and 9 illustrate a carrier in accordance with this invention having mounting members above the level of the platform.

With respect to FIGS. 5–7, there is shown the detail construction of the slide 102. FIGS. 5–7 illustrate in detail the slide 102 having lock and release guide channels generally denoted by the numeral 150. The lock and release guide channels 150 have two separate channels 152 and 154. The guide channel 152 is defined by two ridges 156 and 158 and guides the appropriate member of the carrier 104 into place to enable a blind fit of the slide 102 and carrier 104.

The lock channel 154 is defined by two ridges 160 and 162 and locks the appropriate member of the carrier 104 into position when the slide 102 and carrier 104 are fully connected.

The operation of the lock and release structure will be more fully described with reference to FIGS. 8–12, below.

With respect to FIGS. 8–12, there is shown the carrier 104. The carrier has a base 164 defining a platform 166 having mounting members 167 suitable for compatible connection with the electrical device, for example a memory storage device as described above. The mounting members 167 are raised approximately 0.050" above the surface of the platform 166.

Figure 9:
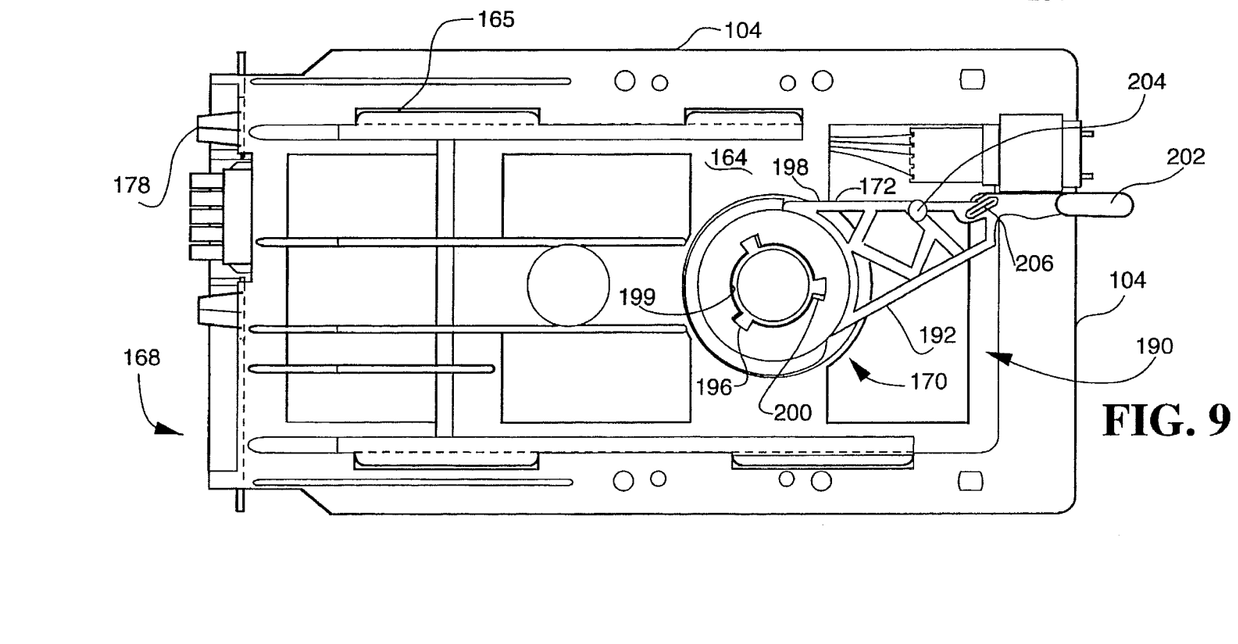

The carrier 104 has two guide rails 165 on either side of the bottom of the carrier 104 as best shown in FIG. 9, which extend the length of the carrier 104. The guide rails 165 are sized and shaped to slideably mate with the slide channels 103.

The carrier 104 is made of an injected molded one piece plastic. It is preferred that the plastic is fiberglass reinforced polycarbonate with a V0 fire retardant added.

Figures 10, 11:
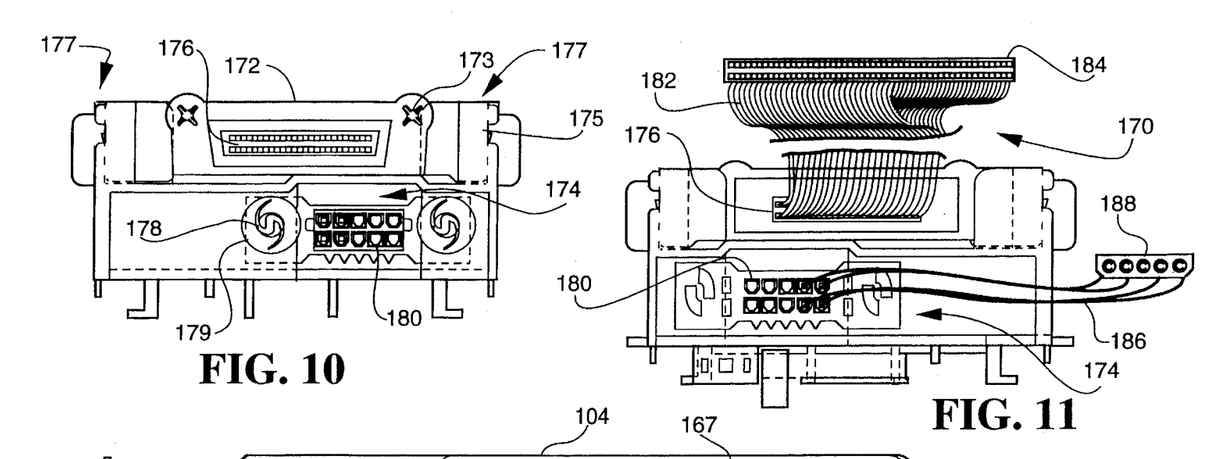
FIG. 10 is a back view of the carrier shown in FIG. 8.
FIG. 11 is a front view of the bracket assembly shown in FIG. 8.
Figure 12:
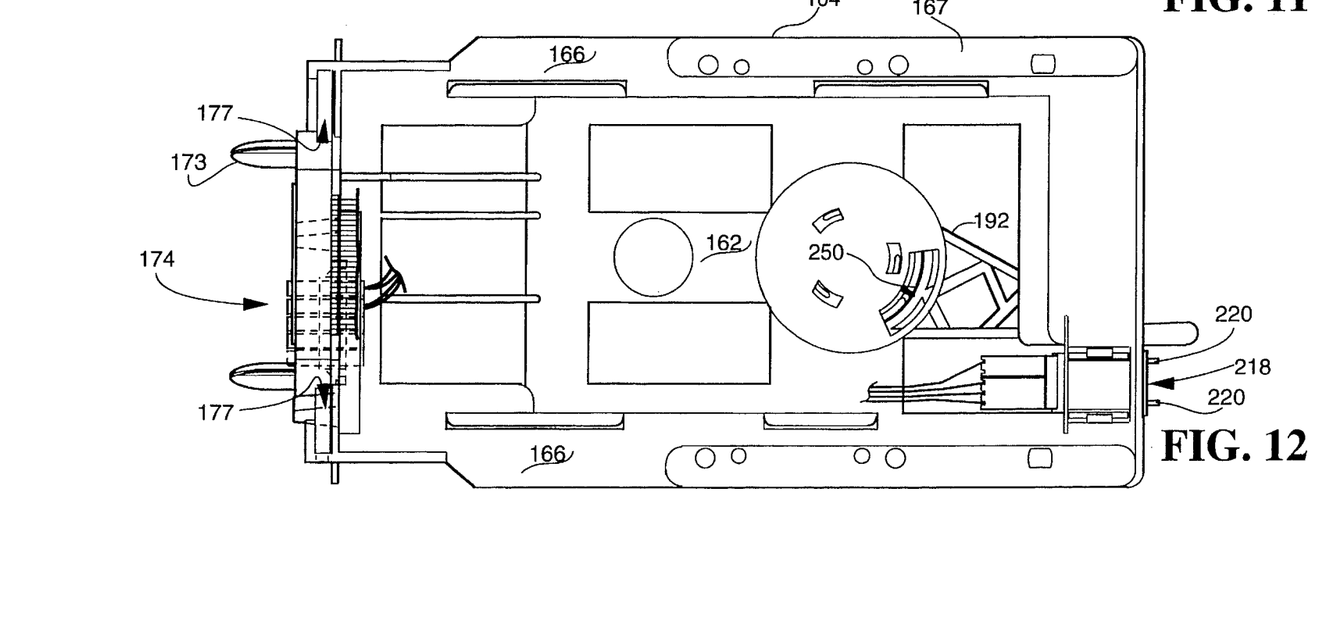
FIG. 12 is a bottom view of the bracket assembly shown in FIG. 8.

The carrier 104 has a distal end 168 having a second electrical interconnect assembly defining a data interconnect assembly generally designated by the numeral 170 as best shown in FIGS. 10–12.

The data interconnect assembly 170 includes a replaceable electrical connector sub-assembly 172. Sub-assembly 172 includes an AMP 50 position Micro SCSI II blind mate connector 176 mounted in an alignment member 171 for compatible connection with second data connector 112 on one end and connection with the electrical device on the other end. This enables data to be transferred to and from the electrical device.

The alignment member 171 includes alignment fingers 173 sized and shaped for compatible sliding engagement with the alignment openings 118.

The alignment member 171 has detentes 175 on its sides. The carrier 104 has a connector slide opening 177 which has compatible detentes for snap on connection with the alignment member 171.

The carrier 104 includes a third electrical interconnect assembly defining a power connector sub-assembly 174. The power connector sub-assembly 174 has snap fit connectors 178 for mounting the sub-assembly 174 onto the carrier 104. The carrier 104 has power cable sub-assembly openings 179. In the preferred embodiment, the snap fit connectors 178 define plastic inserts having spiral ends which contract while being inserted through an opening and expand after being inserted through an opening, such as power cable sub-assembly openings 179 as clearly illustrated in FIGS. 8–12 and most clearly in FIGS. 10 & 12.

The sub-assembly 174 includes a 10 position power supply connector 180 for compatible connection with power supply connector 114 of the slide 102. As described above, and as will be more fully appreciated hereinafter, the connectors 180 and 114 must precisely align in order to make a blind mating fit as well as a fit that does not damage either of the connector or even cause excess or uneven wear.

The power supply connector 180 is a Molex 10 position blind mate SCSI connector adapted for snap fit connection.

The data connector 176 and the power supply connector 180 both have cabling in the preferred embodiment shown in FIG. 11. The data connector 176 has a ribbon cable 182 and a 50 pin IDC connector 184 for connection to the electrical device. The power supply connector 180 has discrete wire cabling 186 connected to a 4 pin power supply connector 188 for connection with the power supply connector on the electrical device. This cabling allows the user to adjust an electrical configuration of the bracket assembly 100 by selecting cables and mating connectors which are compatible with the carrier mounted electrical device.

The carrier 104 includes the remainder of the lock and release assembly generally designated by the numeral 190. The lock and release assembly 190 includes a lever arm 192 rotatably connected to the base 164 as best shown in FIG. 9. The base 164 has a cylindrical extension 194 and locking tabs 196.

The lever arm 192 has a proximal end 197 and an enlarged distal end 198 defining an opening 199. The distal end 198 has slots 200. The slots 200 compatibly mate with the tabs 196 for insertion of the lever arm 192 on the cylindrical extension 194. The opening 199 of the lever arm 192 is sized and shaped to slide over the cylindrical extension 194 for rotatable connection therewith.

Additionally, the distal end 198 of the lever arm 192 has inside slots 250 (FIG. 12) which allow a circular spring (not shown) to be inserted between the lever arm 192 and the cylindrical extension 194 for normally urging the handle 202 to assume the full open position as will be appreciate more fully hereinafter.

The lever arm 192 has a handle 202 on the proximal end of the lever arm 192. Between the distal end 198 and proximal end of the lever arm 192, there is a cam member 204 which is sized and shaped to ride in guide channel 152 as will appreciated more fully hereinafter. The lever arm 192 has a lock member 206 between the cam member 204 and its proximal end.

The lock member 206 is designed to seat in the lock channel 154 once the lever arm 192 causes the data connector 176 and power supply connector 180 to fully engage second data connector 112 and power supply connector 114.

Figure 13:
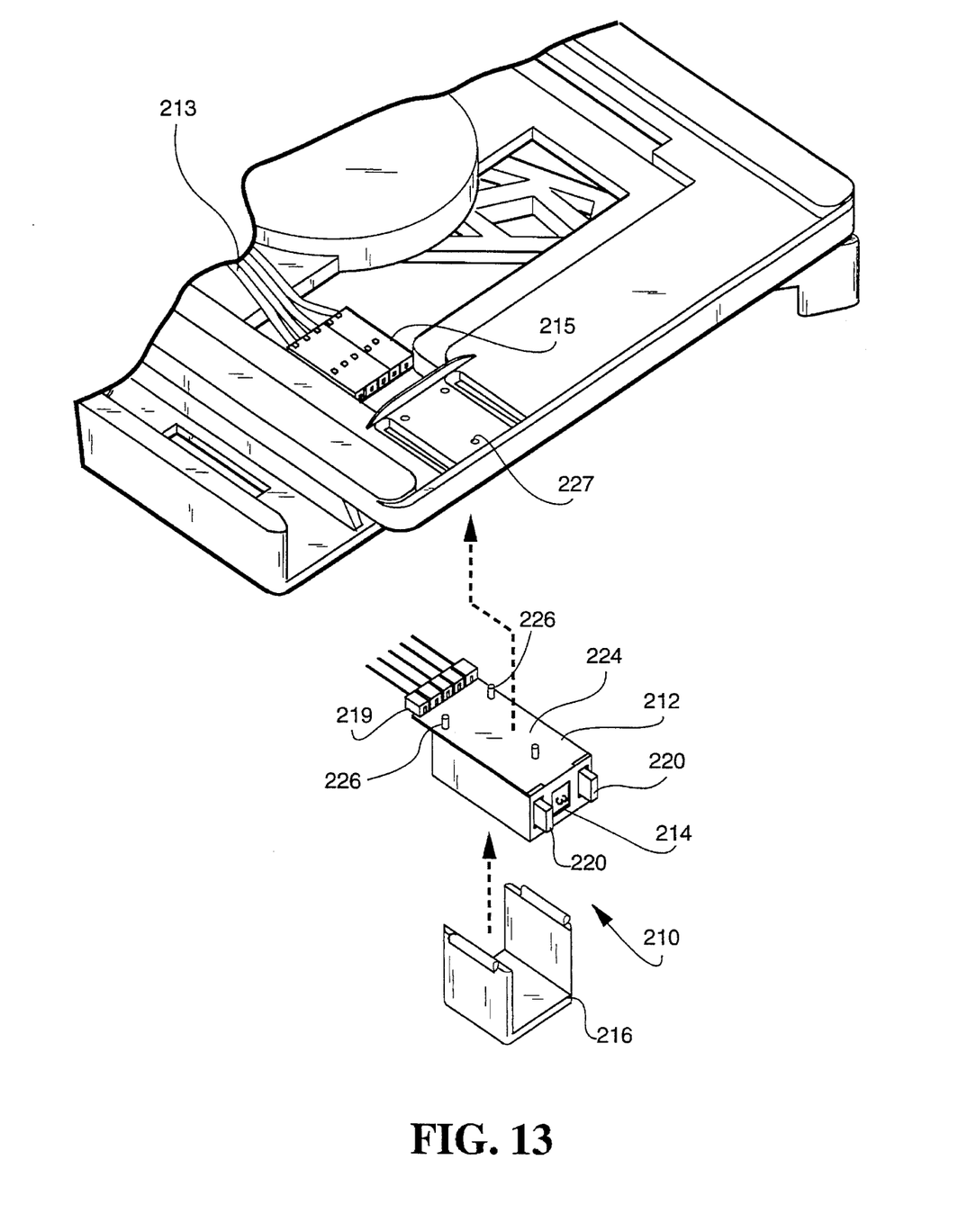
FIG. 13 is an exploded perspective view of the visual identification switch in accordance with this invention.

With particular reference to FIG. 13, there is shown a visual identification switch assembly generally denoted by the numeral 210. The visual identification switch assembly 210 includes switch 212 with a visual display 214 and a housing 216 for enclosing the switch 212.

An identification line 213 includes a switch connector 215 for connection of the identification line 213 to the switch 212 at one end. And, a device connector 217 (FIG. 1) at the other end for connection of the identification line 213 to the electrical device.

The visual identification switch assembly 210 includes the switch 212 having a connector 219 for connecting the switch 212 to the identification line 213. The switch 212 has top surface 224 having a series of pins 226 which are inserted into compatible openings 227 in the carrier 104.

The switch 212 includes a push-button sub-assembly 218 having two buttons 220. Upon pushing one of the buttons 220 the visual display 214 is changed to a digitally higher number. Upon pushing one other of the buttons 220 the visual display 214 is changed to a digitally lower number.

The switch 212 thus assigns the identification number to the electrical device. In the case of a SCSI device, the electrical device is assigned a number between 1 and 7. Each device must be assigned a unique number. The identification number is then carried to the device over identification line 213 to the electrical device. When the electrical device is connected to the bus it transmits this identification number to the bus and thereafter the electrical equipment, namely the computer, knows with which device it is communicating.

As can be appreciated, there is no need to count in binary to obtain the correct unique identification number for the electrical device. Nor does the user need to go to a remote location to change the identification number. Using the visual identification switch assembly in accordance with this invention, changing the identification number is routine and is accomplished with the carrier 104 (and device, if appropriate) remaining mated to the slide 102. The electrical device does not have to be removed from carrier 104, nor does the carrier 104 need to be removed from the slide 102 in order to change the identification number.

The housing 216 has an open, generally rectangular shape and encloses the switch 212. In addition, the lever arm 192 is normally urged toward the housing 216 by the spring 250. The housing 216 acts as a stop for the lever arm 192. The combination of the housing 216 acting as a stop for the lever arm 192, and the slots 200 and locking tabs 196 keeps the lever arm 192 rotatably in place.

Additionally, the stop created by the housing 216 sets the lever arm 192 in the correct position for performing the installation and removal of the carrier 104 from the slide 102.

The housing 216 is plastic. In the preferred embodiment the housing 216 is a fiberglass reinforced polycarbonate with a V0 fire retardant added. The housing 216 has locking tabs 222 which snap fit into compatibly designed openings in the carrier 104.

It is expected that over time, the switch 212 will wear out and need to be replaced. As a result of the visual identification switch assembly in accordance with this invention, the replacement or repair of the switch 212 is made routine and does not affect the operation of any other component of the bracket assembly 100.

As discussed above the identification line 213 is easily fitted to the switch 212. This allows a variety of different sized device connectors 217 to be used to match and be compatible with the particular electrical device desired. For example, some SCSI devices have a SCSI ID connector that will mate only with a 50 mil connector while other SCSI devices have a SCSI connector that will mate only with a 100 mil connector. The visual identification switch assembly in accordance with this invention allows such compatible mating to be routine.

In Use:

The bracket assembly 100 is used to facilitate the rapid and easy installation and removal of a compatible storage device from the computer or work station. The slide member 102 is first installed in an appropriate slot or other location within or associated with the computer. The first data connector 108 (FIG. 2) is attached to a mating connector of the SCSI bus and the power cable connector 136 is attached to a mating connector of the computer power distribution system.

A compatible storage device (not shown) is attached to the mounting members 167 (FIGS. 1, 8 and 12) of the carrier 104. This may be accomplished in a number of ways depending upon a particular storage device configuration. In a typical example, the storage device can be represented by a rectangular enclosure having an approximately flat bottom side and provision for electrical connection on a rear side. Two opposing edges of the flat bottom side of the storage device enclosure are placed upon the mounting members 167 and some attachment means, such as screws, is used to attach the opposing edges to the mounting members 167. The connectors 184, 188 and 217 (FIG. 1) are then attached to mating connectors (not shown) of the storage device. Connector 184 includes the SCSI bus signals, while connector 188 provides operating power to the storage device. Connector 217 is used to connect the visual identification switch assembly 210 to the storage device so that the device can respond to a user assigned device number via the SCSI bus.

The carrier member 104 and its attached storage device are then inserted into the slide member 102. The carrier 104 is slidably mated with the slide 102 by using the guide rails 165 (FIG. 9) to slidably mate with the slide channels 103 (FIG. 2). The carrier 104 is slid into the slide 102 and the fingers 173 (FIGS. 10, 12) are used to engage the alignment openings 118 (FIGS. 1,2 and 4) to obtain proper alignment of the connectors 112 and 114 (FIG. 2) with the connectors 176 and 180 (FIG. 10), respectively.

The lever arm 192 is urged against the housing 216 (FIG. 9) by the spring 250. This orientation of the lever arm 192 results in the cam member 204 being located to engage the slot 152 (FIG. 2). The lever arm 192 is manually operated to rotate it about the cylindrical extension 194, through a full range of rotational travel, causing the ridges 156, 158 to urge the cam member 204 and hence the carrier 104 toward the distal end 120 (FIG. 1) of the slide 102. The interplay of the cam member 204 and the ridges 156, 158 will continue to cause a movement of the carrier 104 with respect to the slide 102 until the lock member 206 (FIG. 9) fully engages slot 154 (FIG. 2). At this point in the rotation of the lever arm 192, the connectors 112, 114 of the slide 102 are fully engaged with the mating connectors 176, 180 of the carrier 104, respectively. In this manner, the lever arm 192 has been used to "cam" the carrier 104 and its attached storage device into a locked position on the slide 102. An electrical connection between the SCSI bus and the storage device is now completed.

The power interrupt switch 142 (FIG. 2) will have been placed in the "off" position during this installation procedure. Maintaining a power off condition during installation or removal of a storage device will help to prevent the potential "head crashes" discussed above.

Figure 1:
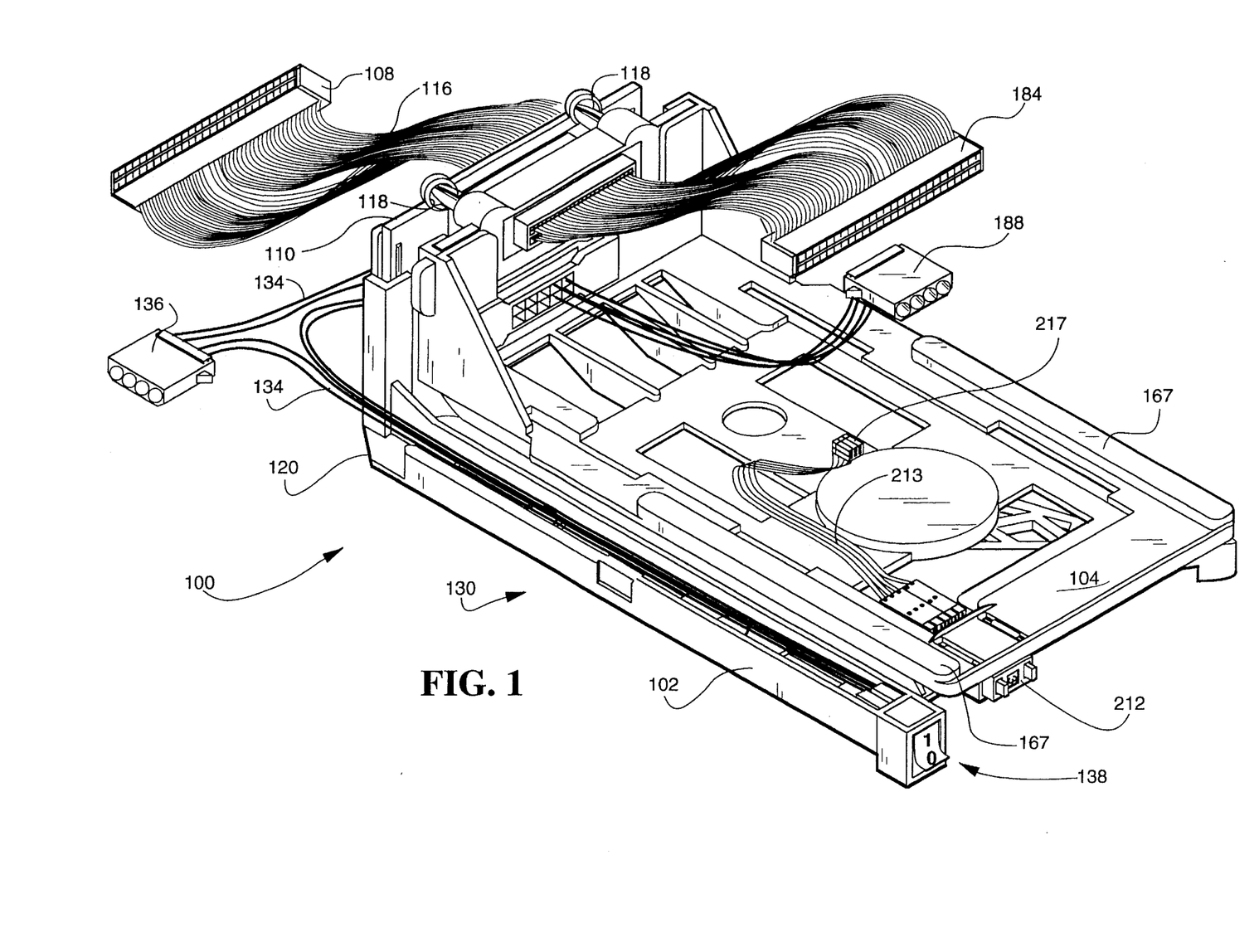
FIG. 1 is an elevated perspective plan view of the bracket assembly in accordance with this invention.

The next step will be to use the visual identification switch 212 (FIG. 1) to set a SCSI device number for the storage device. This should be undertaken before power is applied to the storage device. The SCSI device number will be in a range from "1 to 7" and will be determined by system requirements known to the user. To change the device number, the user will depress and release one of the buttons 220 (FIG. 13) while observing the numeric display 214 which displays the selected device number as a single digit. The device number entered into the switch 212 is electrically connected with the storage device via the interconnecting line 213 and connector 217 (FIG. 1).

When the power interrupt switch 142 is now placed into the "on" position, the storage device will become responsive to commands and inquiries received from the computer via the SCSI bus. The storage device will use the device number provided by the visual identification switch 212 to respond to appropriate bus transactions, according to the SCSI protocols.

To remove a storage device from the computer for exchange with another device or for installation into another computer, the power interrupt switch 142 is first placed into the "off" position to prevent a head crash or other inappropriate device behavior. Next, the lever arm 192 is rotated from its "locked" to its "rest" position. This rotation of the lever arm 192 results in the ridges 156, 158 forcing the cam member 204 along the guide channel 152 in a direction opposite to that taken during installation. This movement causes the connectors 112 and 114 to disengage from the mating connectors 176 and 180. Once this step is accomplished, the carrier and its attached device can be slid away from the distal end 120 of the slide 102 for removal from the computer.

Using the method described above with the bracket assembly 100, a blind mating fit is achieved without damaging the electrical connectors.

Alternative Embodiments

Figure 14:
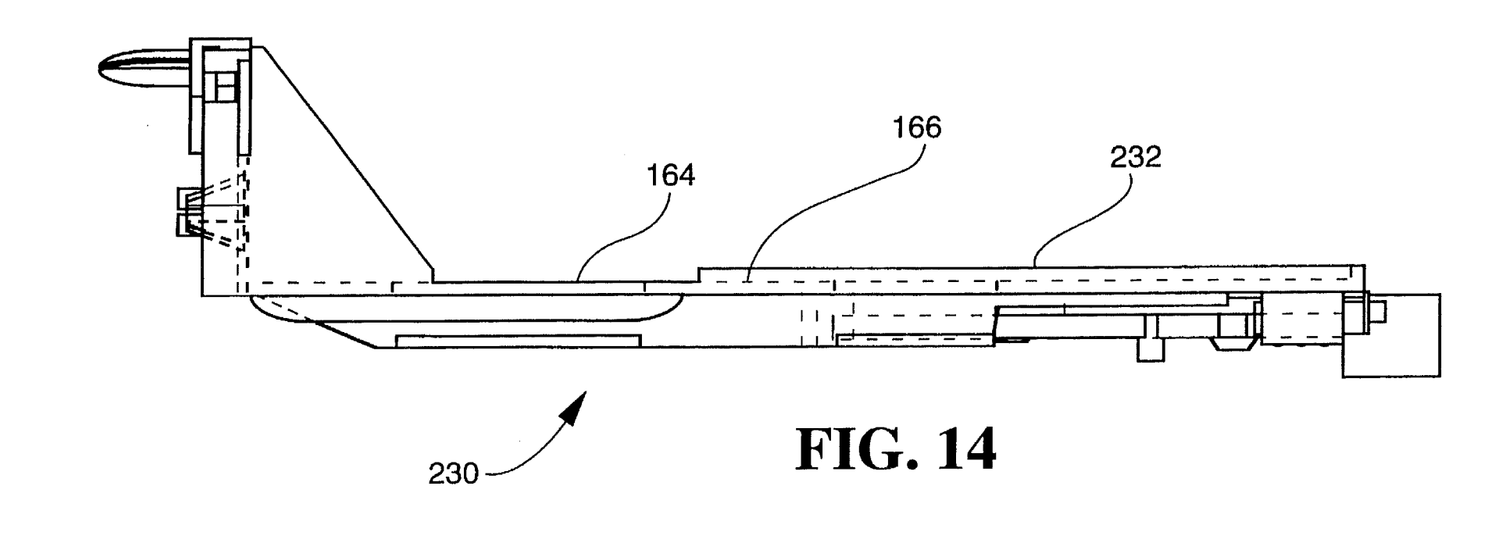
FIG. 14 illustrates an alternate carrier in accordance with this invention, having mounting members generally coincident with, although slightly above, the level of the platform.

With respect to FIG. 14, there is shown an alternate embodiment of the carrier in accordance with this invention, generally designated by the numeral 230. The carrier 230 has a base 164 and a platform 166. The platform 166 has mounting members 232. The mounting members 232 are nearly coincident with the platform 166.

The mounting members are raised within the range of 0.050" and 0.375". This allows the carrier 230 to accommodate a wide variety of different electrical devices.

Figure 15:
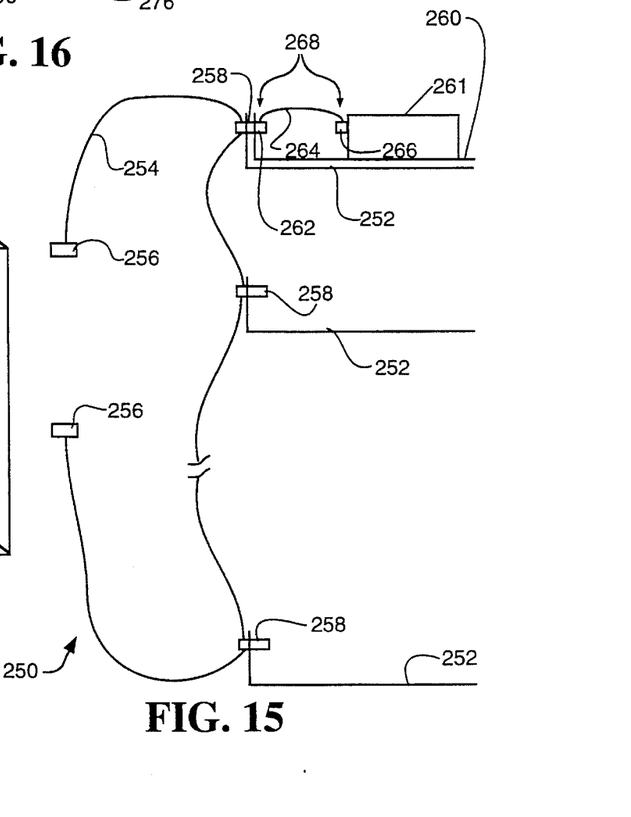
FIG. 15 is a partially schematic diagram of an alternative embodiment of the invention having an array of daisy chained slides of FIG. 4.

FIG. 15 is a schematic diagram illustrating an alternative embodiment having an array 250 of slides 252 daisy chained on a cable 254. The cable 254 has a connector 256 at each end for attachment to a bus of the electrical equipment. Each slide 252 includes a slide data connector 258 which is attached between the ends of the cable 254 for communicating between the slide 252 and the electrical equipment. A carrier 260 having an electrical device 261 can be slid into any slide 252 for operation with the electrical equipment. Each carrier 260 includes a carrier data connector 262, stub cable 264, and device data connector 266 connected to complete the electrical communication between the cable 254 and the electrical device 261.

Either end of the cable 254 may be connected to the SCSI bus of a computer. When used in this manner, the cable 254 acts as an extension of the SCSI bus, the other end of the cable 254 being connected to a bus termination or used to further extend the bus. The slides 252 located along the cable 254 are each adapted to accept a carrier 260 mounted electrical device 261 such as a hard disk. In preferred embodiments, the array 250 includes 2, 4 or 7 slides which are attached to the cable 254. The SCSI bus electrical requirements define a stub length 268 not to exceed 4" between the carrier data connector 262 and the device data connector 266. The stub cable 264 interconnecting these two connectors must not exceed this limit.

Figure 16:
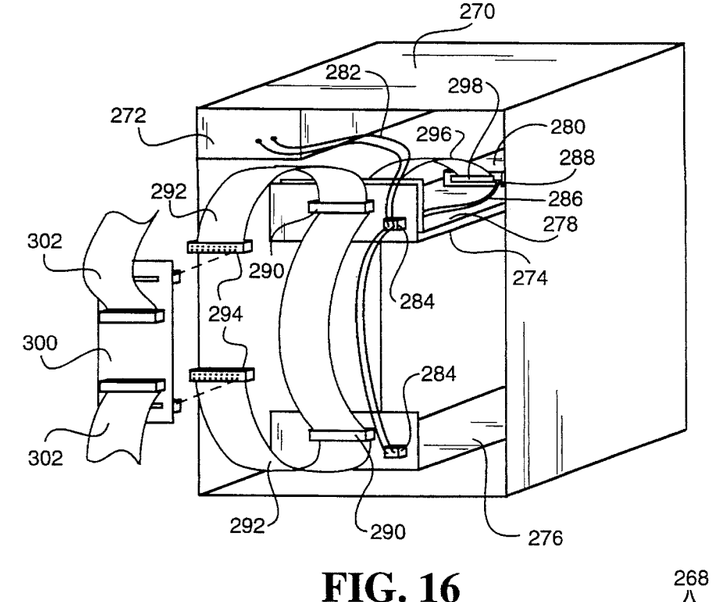
FIG. 16 is a rear perspective view of one embodiment of the array of FIG. 15.

In another preferred embodiment, the array 250 is installed in an enclosure 270 and a power source 272 is provided. FIG. 16 illustrates the enclosure 270 having a power source 272 and two slides 274, 276. One slide 274 is shown mounted above the other slide 276 within the enclosure 270. The power source 272 is connected to each slide via electrical harness 282 and slide power connectors 284.

A carrier 278 including an electrical device 280 is shown inserted into the upper slide 274. A mating power connector on the carrier 278, a carrier electrical harness 286 and a device power connector 288 complete the electrical connection between the slide power connector 284 and the electrical device 280.

Each of the slides 274, 276 includes a slide data connector 290 attached, daisy chain fashion, to a cable 292 as previously illustrated in FIG. 15. Both ends of the cable 292 are attached to identical data connectors 294. Communication between the cable 292 and the electrical device 280 is completed on the carrier 278 via stub cable 296 and device data connector 298. As discussed previously, one of the connectors 294 may be attached to the SCSI bus of a computer or other electrical equipment. The remaining connector 294 is attached to a bus termination or is used to extend the bus.

Some manufacturers supply carrier mounted electrical devices which modify the assignments of signals at pins of the carrier data connector 262 (FIG. 15). The modified pin assignments do not interfere with operation of the system, but the assignments must be restored to the SCSI standard before connection of the cable 292 to the SCSI bus. This restoration of SCSI pin assignments is accomplished in a preferred embodiment through use of an adapter card 300 which is connected to the data connectors 294 as illustrated in FIG. 16. The adapter card receives the signals at the modified pin assignments and redirects the signals to the SCSI pin assignments. The card 300 is purely passive and includes no active circuits. Additional cables 302 are used to connect the adapter card 300 to the SCSI bus, bus termination or bus extension, as previously described.

Figure 17:
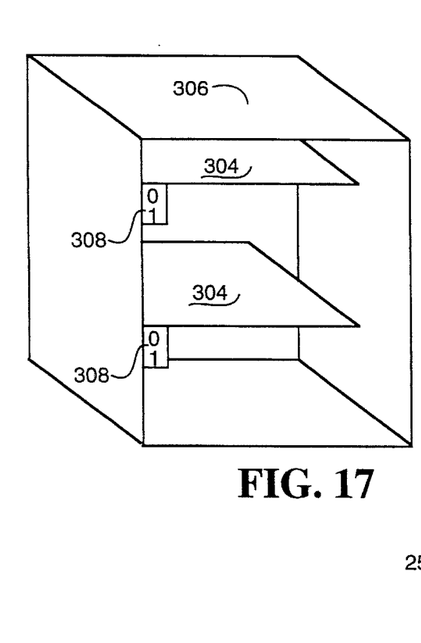
FIG. 17 is a front perspective view of the array of FIG. 16.

With reference to FIG. 17 there is illustrated a perspective view of an array 250 having two slides 304 within an enclosure 306. Each of the slides 304 includes a power interrupt switch 308 which is used to electrically connect and to disconnect the power source 272 (FIG. 16) from the slide power connector 284 (FIG. 16). This feature allows power to be disconnected before a carrier mounted electrical device is removed or installed, as previously discussed.

Figure 18:
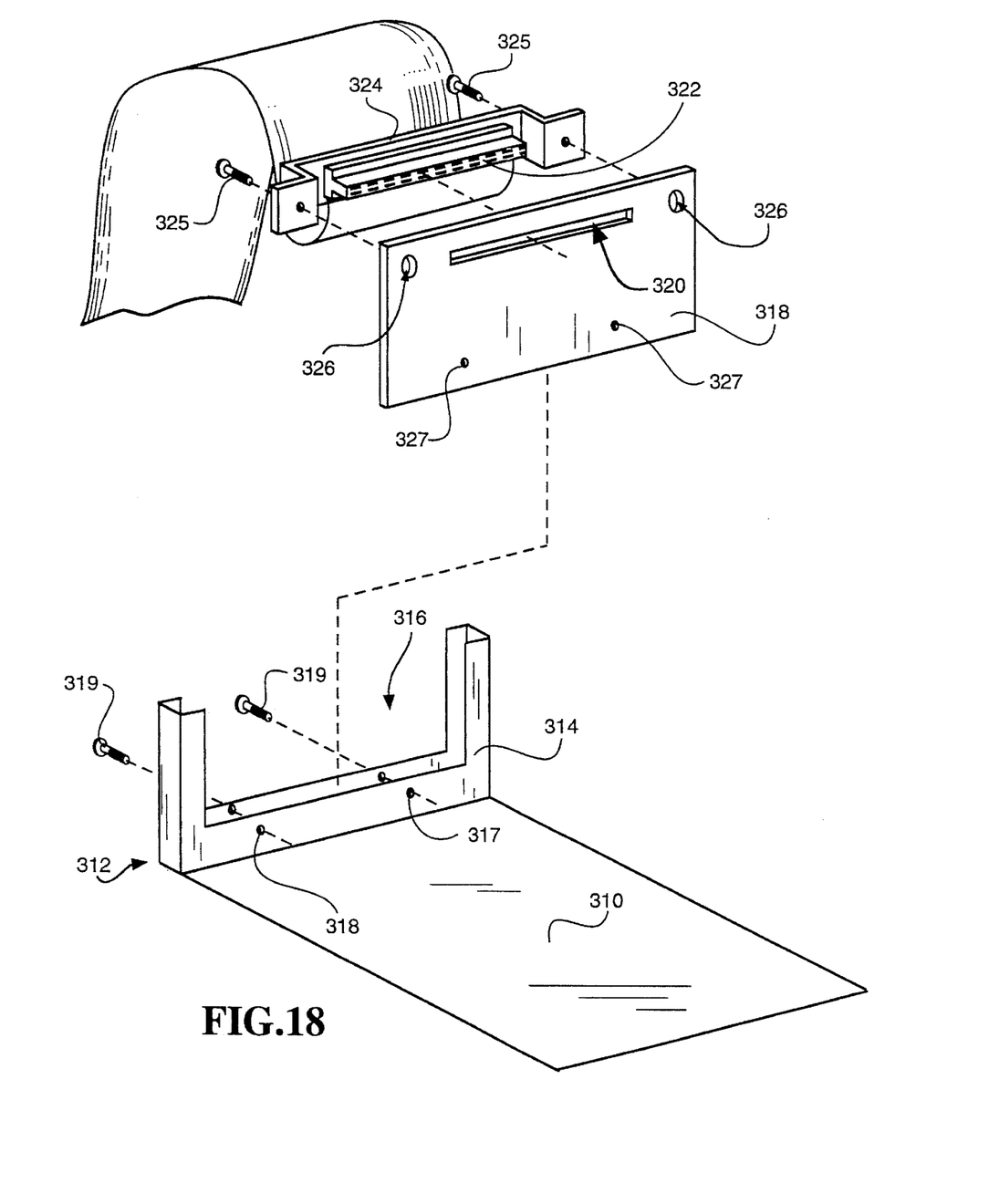
FIG. 18 is an exploded perspective view of a distal end of the slide of FIGS. 15–17.

With particular reference to FIG. 18 there is illustrated a slide 310 having a distal end 312. The slide 310 includes an upstanding member 314 disposed in a plane perpendicular to the slide at the distal end 312. The upstanding member 314 includes a slot 316 for accepting a support member 318, and has openings 317 for receiving screws 319 or the like used to lock the support member 318 in the slot 316.

The support member 318 includes an opening 320 for accepting and retaining a cable mount data connector 322. A retainer 324 maintains the data connector 322 within the opening 320 of the support member 318. The retainer is held in place by screws 325 or the like. The support member 318 also includes alignment openings 326 for engaging mating carrier alignment fingers, and has openings 327 for engaging screws 319.

In a preferred embodiment, data connector 322 is an AMP male, cable mount, mass terminated micro connector having pins on 0.025" centers. In a wide SCSI bus system, the data connector will have 68 pins. In a narrow SCSI bus, the data connector 322 will have 50 pins. Data connector 322 is crimped to cable 254 (FIG. 15) for communication with the SCSI bus of the electrical equipment. The retainer 324 also serves to prevent accidental damage to the crimp connection between the cable 254 and the data connector 322 caused by repeated insertions of the carrier mating connector 258 (FIG. 15).

While the foregoing detailed description has described several embodiments of the bracket assembly in accordance with this invention, various embodiments of the carrier and slide are within the scope of this invention. Particularly, there are a wide variety of lock release mechanisms that would employ a cam and guide that would fall within the scope of this invention. Additionally, there are a variety of ways for having each interconnect assembly fasten to its appropriate place on the slide or carrier. The same is true for the way the visual identification switch assembly fastens to the carrier. Thus, the invention is to be limited only by the claims as set forth below.

What is claimed is:

1. An array of daisy chained slides for receiving carrier mounted electrical devices for connection with electrical equipment, comprising:

a bus cable having two ends and a data connector attached at each end, the bus cable being ribbon cable and adapted for connection with the electrical equipment;

a plurality of slides, each slide having a slide data connector crimped to the bus cable between the ends in daisy chained fashion, each slide being adapted to receive a carrier compatible for sliding and mating connection with the slide;

an electrical configuration adjustment means electronically connectable with the bus for establishing a compatible connection between the electrical devices and the electrical equipment;

the slide data connector of at least one slide being a mass terminated, cable mount micro connector, and said at least one slide including support for the mass terminated, cable mount micro connector to inhibit damage to the crimped connection between said connector and the bus cable.

2. The array of daisy chained slides as set forth in claim 1, including at least two slides.

3. The array of daisy chained slides as set forth in claim 1, including at least four slides.

4. The array of daisy chained slides as set forth in claim 1, including at least seven slides.

5. The array of daisy chained slides as set forth in claim 1, wherein the ribbon cable has conductors at 0.025" centers and each data connector is an AMP® 68-pin, mass terminated, cable mount Micro Connector®.

6. The array of daisy chained slides as set forth in claim 1, wherein the ribbon cable has conductors at 0.025" centers and each data connector is an AMP® 50-pin, mass terminated, cable mount Micro Connector®.

7. The array of daisy chained slides as set forth in claim 1, further including at least one carrier and electrical device, the at least one carrier and electrical device being mated compatibly with one of the slides.

8. The array of daisy chained slides as set forth in claim 1, further including an enclosure, the slides being disposed within the enclosure.

9. The array of daisy chained slides as set forth in claim 1, further including a power source for supplying operating power to each slide.

10. The array of daisy chained slides as set forth in claim 9, wherein each slide includes a slide power connector electrically connected to the power source.

11. The array of daisy chained slides as set forth in claim 10, wherein each slide includes electrical interrupt means for interrupting electrical power to the carrier and electrical device.

12. The array of daisy chained slides as set forth in claim 1, wherein said at least one slide includes a base, a distal end, an upstanding member disposed at the distal end in a plane perpendicular to the base, and wherein the support for the mass terminated, cable mount micro connector comprises a support member, the upstanding member having a slot for receiving the support member, whereby the slide data connector is supported by the support member in a plane perpendicular to the base for compatibly mating with the carrier data connector.

13. The array of daisy chained slides of claim 12 wherein the support member includes an opening for receiving a portion of the slide data connector and wherein retaining means retains the connector in the opening and supports the connector to prevent damage to the crimp connection between the connector and the ribbon cable.

14. The array of daisy chained slides as set forth in claim 7, further including the carrier having a carrier data connector for mating with the slide data connector, the carrier also having a stub cable having two ends, one end connected to the carrier data connector and the other end being attached to a device data connector for connection to the electrical device, and the stub cable being a ribbon cable compatible with the bus cable.

15. The array of daisy chained slides as set forth in claim 14, wherein the stub cable has length less than 4" measured between the carrier data connector and the device data connector.

16. The array of daisy chained slides as set forth in claim 1, further including passive adapter card means for modifying and restoring SCSI pin assignments.

17. The array of daisy chained slides as set forth in claim 10, wherein each slide includes a power switch for connecting and disconnecting the power source at the carrier power connector.

18. The array of daisy chained slides as set forth in claim 14, further including a power source for supplying operating power to each slide.

19. The array of daisy chained slides as set forth in claim 18, wherein each slide includes a slide power connector electrically connected to the power source, and the carrier includes a carrier power connector for compatibly mating with the slide power connector.

* * * * *